United States Patent
Kikushima

(10) Patent No.: US 9,590,585 B2
(45) Date of Patent: Mar. 7, 2017

(54) RESONATION DEVICE, OSCILLATOR, ELECTRONIC APPARATUS, AND MOVING OBJECT

(71) Applicant: SEIKO EPSON CORPORATION, Tokyo (JP)

(72) Inventor: Masayuki Kikushima, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/990,247

(22) Filed: Jan. 7, 2016

(65) Prior Publication Data

US 2016/0204759 A1    Jul. 14, 2016

(30) Foreign Application Priority Data

Jan. 13, 2015  (JP) ................................. 2015-003924

(51) Int. Cl.

| | |
|---|---|
| H03H 9/02 | (2006.01) |
| H03B 5/04 | (2006.01) |
| H03B 5/32 | (2006.01) |
| H03H 9/05 | (2006.01) |
| H03H 9/10 | (2006.01) |

(52) U.S. Cl.
CPC ........... H03H 9/02448 (2013.01); H03B 5/04 (2013.01); H03B 5/32 (2013.01); H03H 9/0547 (2013.01); H03H 9/0552 (2013.01); H03H 9/1021 (2013.01)

(58) Field of Classification Search
CPC .............................. H03H 9/02448; H03B 5/04
USPC ......................................................... 331/69, 70
See application file for complete search history.

(56) References Cited

U.S. PATENT DOCUMENTS

| | | | | |
|---|---|---|---|---|
| 6,501,340 B1 * | 12/2002 | Flood | ......................... | H03L 1/04 310/315 |
| 9,019,022 B2 * | 4/2015 | Liu | ........................... | H05K 3/30 331/69 |
| 2010/0231309 A1 * | 9/2010 | Arai | ......................... | H03B 1/02 331/69 |

FOREIGN PATENT DOCUMENTS

| | | |
|---|---|---|
| JP | H10-294618 A | 11/1998 |
| JP | 2006-080180 A | 3/2006 |
| JP | 2010-288249 A | 12/2010 |

* cited by examiner

*Primary Examiner* — Joseph Chang
(74) *Attorney, Agent, or Firm* — Oliff PLC

(57) ABSTRACT

A resonation device includes substrate, a resonation element that is attached to first main surface of substrate at first and second attachment portion, and heat-generating unit that is disposed on second main surface which is side opposite to first main surface so as to overlap with resonation element in a planar view. When an angle formed by line which connects center of resonation element and center of first attachment portion and virtual line which connects center of heat-generating unit and center of resonation element in a planar view is $\theta_1$ and an angle formed by a line which connects center of resonation element and center of second attachment portion and virtual line which connects center of heat-generating unit and center of resonation element in a planar view is $\theta_2$, conditions $0°<\theta_1<90°$, $0°<\theta_2<90°$, and $0°<|\theta_1-\theta_2|<10°$ are satisfied.

17 Claims, 7 Drawing Sheets

RESONATION DEVICE, OSCILLATOR, ELECTRONIC APPARATUS, AND MOVING OBJECT

BACKGROUND

1. Technical Field

The present invention relates to a resonation device, an oscillator, an electronic apparatus, and a moving object.

2. Related Art

As a frequency generation source for supplying stable frequencies, crystal oscillators are widely utilized in clock signal sources and the like of broadcasting instruments, measuring instruments, and digital instruments. Particularly, in a crystal oscillator with heater (oven controlled xtal oscillator: hereinafter, referred to as the OCXO), a small-sized heater and a quartz crystal resonator are accommodated in a container and the ambient temperature of a resonation element is uniformly maintained so that highly favorable frequency stability is attained.

As an example of such an OCXO, JP-A-2010-288249 has proposed a resonation device (piezoelectric device) in which a heater (heater element) is provided directly under a resonation element (piezoelectric element) of which both ends are supported so that heat conduction to the outside of the container (package) can be prevented and the resonation element (piezoelectric element) can be heated while suppressing energy.

However, according to the resonation device disclosed in JP-A-2010-288249, a distance between attachment portions (base portions) for mounting the resonation element in the package is long. Therefore, due to the difference between heat expansion coefficients of the resonation element and the package, significant thermal stress is generated between the resonation element and the package during a heat processing step in the manufacture, thereby resulting in a disadvantage in that oscillation frequencies of the resonation device fluctuate.

SUMMARY

An advantage of some aspects of the invention is to solve at least a part of the problems described above, and the invention can be implemented as the following forms or application examples.

Application Example 1

A resonation device according to this application example includes: a substrate; a resonation element that is attached to a first main surface of the substrate at a first attachment portion and a second attachment portion; and a heat-generating unit that is disposed on a second main surface which is a side opposite to the first main surface so as to overlap with the resonation element in a planar view. When an angle formed by a line which connects a center of the resonation element and a center of the first attachment portion and a virtual line which connects a center of the heat-generating unit and the center of the resonation element in a planar view is $\theta_1$ and an angle formed by a line which connects the center of the resonation element and a center of the second attachment portion and the virtual line which connects the center of the heat-generating unit and the center of the resonation element in a planar view is $\theta_2$, conditions $0°<\theta_1<90°$, $0°<\theta_2<90°$, and $0°<|\theta_1-\theta_2|<10°$ are satisfied.

According to this application example, the distance between the first attachment portion and the second attachment portion is shortened, and the first attachment portion and the second attachment portion are disposed at positions in substantially line symmetry with respect to the virtual line which connects the center of a heater that is the heat-generating unit and the center of the resonation element, in a planar view of the substrate. Therefore, during a heat processing step in the manufacture at the time of drying, reflowing, and the like, the magnitude of thermal stress (in-plane stress) which is generated due to the difference between heat expansion coefficients of the resonation element and the substrate, and is added to the resonation element can be reduced, and thus, it is possible to reduce the fluctuation in the oscillation frequencies of the resonation device.

Application Example 2

In the resonation device according to the application example, conditions $0°<\theta_1<30°$ and $0°<\theta_2<30°$ may be satisfied.

According to this application example, the distance between the first attachment portion and the second attachment portion is shortened further. Thus, it is possible to further reduce thermal stress which is generated during the heat processing step in the manufacture due to the difference between heat expansion coefficients of the resonation element and the substrate.

Application Example 3

In the resonation device according to the application example, conditions $0°<\theta_1<15°$ and $0°<\theta_2<15°$ may be satisfied.

According to this application example, the distance between the first attachment portion and the second attachment portion is shortened further. Thus, it is possible to further reduce thermal stress which is generated during the heat processing step in the manufacture due to the difference between heat expansion coefficients of the resonation element and the substrate.

Application Example 4

An oscillator according to this application example includes: the resonation device according to any one of Application Examples 1 to 3.

According to this application example, the oscillator is provided with the resonation device in which changes in the oscillation frequencies caused by the influence of thermal stress which is generated during the heat processing step in the manufacture at the time of mount drying in which the resonation element is mounted in the substrate, reflowing in which the oscillator is embedded in another electronic apparatus, or the like, are reduced. Therefore, it is possible to provide an oscillator having stable oscillation frequencies.

Application Example 5

An electronic apparatus according to this application example includes: the resonation device according to any one of Application Examples 1 to 3.

According to this application example, the electronic apparatus is provided with the resonation device in which changes in the oscillation frequencies caused by the influence of thermal stress which is generated during the heat processing step in the manufacture at the time of mount drying in which the resonation element is mounted in the substrate, reflowing in which the oscillator is embedded in another electronic apparatus, or the like, are reduced. Therefore, it is possible to provide an electronic apparatus which excels in aging characteristics and has highly stable characteristics.

Application Example 6

A moving object according to this application example includes: the resonation device according to any one of Application Examples 1 to 3.

According to this application example, the moving object is provided with the resonation device in which changes in the oscillation frequencies caused by the influence of thermal stress which is generated during the heat processing step in the manufacture at the time of mount drying in which the resonation element is mounted in the substrate, reflowing in which the oscillator is embedded in another electronic apparatus, or the like, are reduced. Therefore, it is possible to provide a moving object which excels in aging characteristics and has highly stable characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
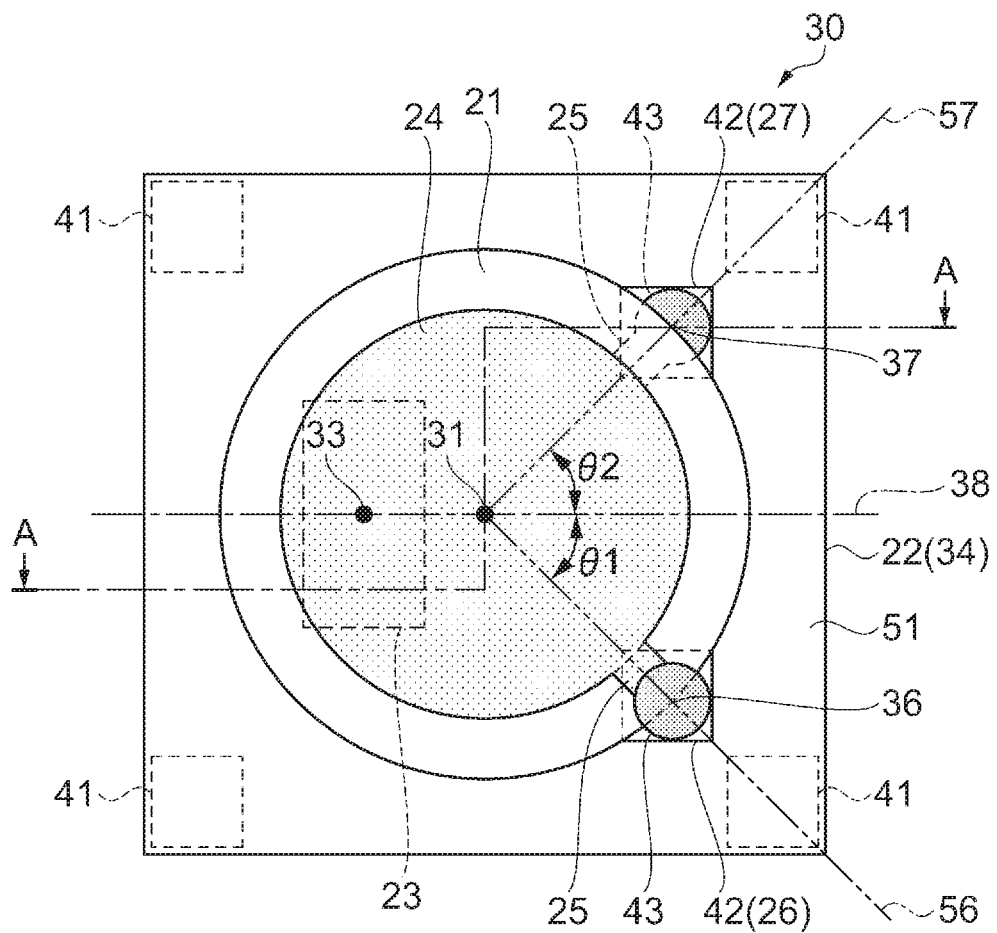
FIG. 1 is a schematic plan view illustrating a quartz crystal resonator as a resonation device according to a first embodiment in which a heater is mounted.

Hereinafter, embodiments in which the invention is specified will be described with reference to the drawings. In the following drawings, in order to make the descriptions easy to understand by illustrating each layer and each member in recognizable sizes, the measurement of each layer and each member may be disclosed differently from the actual measurement.

First Embodiment

First, descriptions will be given regarding a quartz crystal resonator 30 mounted with a heater 23 which is a heat-generating unit as a resonation device, according to the present embodiment. In each of the following drawings, the same or similar configuration components will be presented by being applied with the same or similar reference numerals and signs.

Quartz Crystal Resonator

Figure 2:
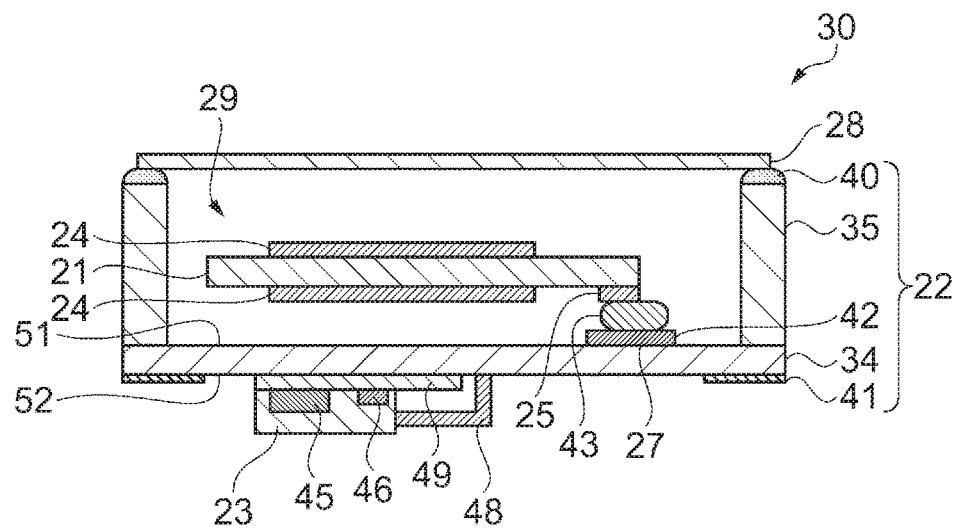
FIG. 2 is a cross-sectional view taken along line A-A in FIG. 1.

FIG. 1 is a schematic plan view illustrating the quartz crystal resonator 30 in which the heater 23 is mounted as a resonation device, according to a first embodiment. FIG. 2 is a cross-sectional view taken along line A-A in FIG. 1. As illustrated in FIGS. 1 and 2, the quartz crystal resonator 30 is provided with a package 22, the heater 23, a resonation element 21, a lid 28, and the like. For convenience of descriptions, illustration of the lid 28 is omitted in FIG. 1. Hereinafter, each of the portions in the quartz crystal resonator 30 will be sequentially described with reference to FIGS. 1 and 2.

In FIG. 2, while having the resonation element 21 as a fiducial mark, descriptions will be given considering that the upward direction is a direction in which the lid 28 is disposed and the downward direction is a direction in which a bottom plate 34 of the package 22 is disposed. In the descriptions for each of the members such as the resonation element 21, the bottom plate 34, and side walls 35, a surface disposed in the upward direction is considered to be the top surface, and a surface disposed in the downward direction is considered to be the bottom surface.

Package

First, the package 22 will be described. As illustrated in FIG. 2, the package 22 is configured to include the bottom plate 34 which is a plate-like substrate, the side walls 35, seaming rings 40, pad electrodes 41, external connection electrodes 42, and the like.

The resonation element 21 is connected to the first main surface 51 which is the top surface of the bottom plate 34 by applying a conductive adhesive 43 onto the external connection electrode 42. Meanwhile, the below-described heater 23, a plurality of the pad electrodes 41, and the like are provided on a side opposite to the first main surface 51, that is, on a second main surface 52 which is the bottom surface of the bottom plate 34.

The first main surface 51 is provided with two external connection electrodes 42 which are electrodes for fixing the resonation element 21 to the bottom plate 34 of the package 22 in a cantilever manner.

As the conductive adhesive 43, it is possible to use a silicone-based conductive adhesive, an epoxy-based conductive adhesive, a polyimide-based conductive adhesive, or the like which is obtained by causing conductive particles such as silver (Ag) fine grains to be included in a synthetic resin agent that has an adhesive ingredients exhibiting bonding force. When the resonation element 21 is connected to the bottom plate 34 by using the conductive adhesive 43, it is possible to achieve both mechanical fixation and electrical connection.

The side walls 35 are provided at the outer surface peripheral edge portion of the first main surface 51 in a rim state. The bottom plate 34 and the side walls 35 are made of a ceramic material having a heat expansion coefficient which coincides with or approximates to the heat expansion coefficient of the resonation element 21 or the below-described lid 28. Specifically, the bottom plate 34 and the side walls 35 are formed by laminating and sintering ceramic green sheets which are formed with sheet-like (rectangular-shaped) kneaded mixtures generated by dispersing ceramic powder in a predetermined solution and adding a binder thereto.

The seaming ring 40 is formed with an alloy of kovar, for example, in a rim state (substantially rectangular periphery state) along the top surfaces of the side walls 35. The seaming ring 40 is a member for bonding the lid 28 and the top surfaces of the side walls 35.

In the present embodiment as illustrated in FIGS. 1 and 2, the pad electrodes 41 are provided one each at four corner portions of the second main surface 52. The pad electrodes 41 are connected to the external connection electrodes 42, an external substrate, and the like, thereby supplying drive voltages to the quartz crystal resonator 30. The electrodes also output frequencies which are oscillated from the quartz crystal resonator 30, to the outside.

The pad electrodes 41 and the external connection electrodes 42 are formed by performing sintering after forming needed shapes using conductive pastes such as silver (Ag) and palladium (Pd), or metalized tungsten, for example, and thereby plating nickel (Ni), and gold (Au), silver (Ag), or the like.

Heater

Subsequently, the heater 23 which is a heat-generating unit will be described with reference to FIGS. 1 and 2. As illustrated in FIGS. 1 and 2, the heater 23 is fixed to the second main surface 52 by using a resin adhesive (not illustrated) so as to overlap with the resonation element 21 in a planar view of the package 22.

As illustrated in FIG. 2, the heater 23 is an electronic component which is configured to include a heat-generating body 45, a temperature sensor 46, and the like. The heat-generating body 45 is a power transistor or the like for heating the quartz crystal resonator 30 so as to maintain a constant temperature, which is a so-called thermostatic function.

Moreover, the heater 23 includes a connection portion 48 which extends from one surface of the heater 23. The connection portion 48 mechanically fixes the heater 23 to the second main surface 52, and wiring is provided so as to be able to supply electric currents to the heater 23.

The heat-generating body 45 is acceptable as long as the heat-generating body can generate heat when electric currents flow. Fixed resistors such as a carbon film resistor and a metal film resistor, resistors such as a variable resistor and a semi-fixed resistor, and electrically resistant element-type or chip-type wiring which is made of platinum or other conductive materials can be exemplified. The temperature of the heat-generating body 45 is controlled by the temperature sensor 46 which measures and controls the temperature so as to maintain a constant temperature.

A heat conduction layer 49 having heat conductivity higher than that of the bottom plate 34 may be provided between the heater 23 and the second main surface 52 so as to face the heat-generating body 45. In such a case, the heater 23 and the bottom plate 34 of the package 22 come into contact with the outer surfaces of the heat conduction layer 49. In this manner, the contact area between the heater 23 and the package 22 via the heat conduction layer 49 is widened so that heat (heat energy) from the heat-generating body 45 can be efficiently transferred to the quartz crystal resonator 30. Therefore, temperature changes of the resonation element 21 connected to the package 22 are reduced, and thus, frequency stability is enhanced further and low power consumption can be achieved.

Resonation Element

Subsequently, the resonation element 21 will be described. As the resonation element 21 according to the present embodiment, an AT cut quartz crystal substrate (piezoelectric substrate) which is formed of crystal quartz as an example of a piezoelectric material is used. The piezoelectric material (not illustrated) such as crystal quartz belongs to a trigonal system and has crystal axes X, Y, and Z which are orthogonal to one another. X-axis, Y-axis, and Z-axis are respectively called the electrical axis, a mechanical axis, and an optical axis. The quartz crystal substrate employs a flat plate which is cut out from crystal quartz along a plane to which an XZ-plane is caused to rotate around the X-axis by a predetermined angle θ.

For example, in a case of the AT cut quartz crystal substrate, the angle θ approximates 35°15'. The Y-axis and the Z-axis are also caused to rotate around the X-axis by the angle θ, thereby being Y'-axis and Z'-axis respectively. Therefore, the AT cut quartz crystal substrate has crystal axes X, Y', and Z' which are orthogonal to one another. In the AT cut quartz crystal substrate, the thickness direction is the Y'-axis, an XZ' plane (plane including the X-axis and the Z'-axis) orthogonal to the Y'-axis is the main surface, and thickness shear resonation is excited as main resonation.

It is possible to obtain the piezoelectric substrate of the resonation element 21 by processing the AT cut quartz crystal substrate. In other words, the piezoelectric substrate is formed with the AT cut quartz crystal substrate in which an axis to which the Z-axis is inclined in the negative Y-direction of the Y-axis is the Z'-axis, an axis to which the Y-axis is inclined in the positive Z-direction of the Z-axis is the Y'-axis, and a direction which is configured to be a plane parallel to the X-axis and the Z'-axis and is parallel to the Y'-axis is the thickness, while having the X-axis as the center in the orthogonal coordinate system including the X-axis (electronical axis), the Y-axis (mechanical axis), and the Z-axis (optical axis).

The resonation element 21 is not limited to an AT cut resonation element. An SC cut resonation element, a tuning fork-type resonation element, a dual tuning fork-type resonation element, and the like can be exemplified. The SC cut resonation element is a double rotation cut resonation element which has a side parallel to an X'-axis which is set by rotating the X-axis within a range of α from 3° to 30° in the clockwise direction around the above-referenced Z-axis and has side parallel to the Z'-axis which is set by rotating the Z-axis within a range of β from 33° to 36° in the clockwise direction around the X'-axis. In the present embodiment, α is approximately 22°, and β is approximately 34°.

The function of the quartz crystal resonator 30 as a device is determined depending on the type of the resonation element 21. For example, when the resonation element 21 is the AT cut resonation element, the tuning fork-type resonation element, or the dual tuning fork-type resonation element, the quartz crystal resonator 30 becomes a timing device by being embedded in a clock module, an oscillator 90 described below, or the like.

In FIG. 1, the resonation element 21 is illustrated to have a substantially circular shape. However, the resonation element 21 may have a polygonal shape such as a rectangular shape, a hexagonal shape, and an octagonal; and an oval shape. In FIG. 2, both the surfaces of the resonation element 21 are illustrated to have flat shape (plate shape). However, the quartz crystal substrate may have a plano-convex shape by processing only one surface in a lens state so as to be advantageous for miniaturization, or may have a bi-convex shape by processing both the surfaces thereof in lens shapes.

Moreover, the resonation element 21 may be formed with the piezoelectric material such as lithium tantalate and lithium niobate. When the resonation element 21 is formed with a material other than crystal quartz, the azimuth of the crystal (angle of cut) and the like are selected so as to exhibit practice similar to that in a case of being formed with crystal quartz.

As illustrated in FIGS. 1 and 2, excitation electrodes 24 and extracting electrodes 25 are formed on the outer surfaces of the resonation element 21. The excitation electrodes 24 are electrodes for exciting the above-referenced thickness shear resonation with respect to the resonation element 21. The excitation electrodes 24 are formed at central portions on the upward and bottom surfaces of the resonation element 21 while having a substantially circular shape to be slightly smaller compared to the outer shape of the resonation element 21. The excitation electrode 24 on the bottom surface is formed to face the excitation electrode 24 on the top surface.

The extracting electrodes 25 are electrodes for electrically connecting the excitation electrodes 24 and the external connection electrodes 42 of the package 22, for example, by applying the conductive adhesive 43. The extracting electrodes 25 are disposed on the top and bottom surfaces of the resonation element 21. The extracting electrode 25 on the top surface of the resonation element 21 is formed from an end portion of the excitation electrode 24 disposed on the top surface to an end portion of the resonation element 21 overlapping with the external connection electrode 42 on one side. The extracting electrode 25 on the bottom surface of the resonation element 21 is formed from an end portion of the excitation electrode 24 disposed on the bottom surface to an end portion of the resonation element 21 overlapping with the external connection electrode 42 on the other side.

Attachment Portion

Subsequently, the attachment portion will be described. As illustrated in FIGS. 1 and 2, the resonation element 21 is fixed to the bottom plate 34 of the package 22 in a cantilever manner by applying the conductive adhesive 43 or the like onto the external connection electrodes 42 at two places disposed on the first main surface 51 and drying the conductive adhesive 43.

Between the two places to which the resonation element 21 is fixed, one side connected to the excitation electrode 24 (the extracting electrode 25) on the top surface is referred to as the first attachment portion 26, and the other side connected to the excitation electrode 24 (the extracting electrode 25) on the bottom surface is referred to as the second attachment portion 27.

In the first attachment portion 26, in order to attain conduction between the external connection electrodes 42 and the excitation electrode 24 which is formed on the top surface of the resonation element 21, the conductive adhesive 43 is applied to the external connection electrode 42, the resonation element 21 is mounted so as to cause the end portion of the resonation element 21 to overlap with the applied conductive adhesive 43, and then, the conductive adhesive 43 is applied thereupon.

In the second attachment portion 27, in order to attain conduction between the external connection electrodes 42 and the excitation electrode 24 which is formed on the bottom surface of the resonation element 21, the conductive adhesive 43 may be applied to the external connection electrodes 42, the resonation element 21 may be mounted so as to cause the end portion of the resonation element 21 to overlap with the applied conductive adhesive 43, and the conductive adhesive 43 does not need to be applied thereupon as in the case of the first attachment portion 26.

As a method of fixing the resonation element 21, bump bonding may be used by using a bump formed with metal on the external connection electrode 42 of the bottom plate 34.

As illustrated in FIG. 1, when a line connecting a center 33 of the heater and a center 31 of the resonation element in a planar view of the package 22 is considered to be a virtual center line 38 which is a virtual line, the first attachment portion 26 and the second attachment portion 27 are disposed at positions in substantially line symmetry with respect to the virtual center line 38.

The center 33 of the heater is disposed on a side opposite to the first attachment portion 26 and the second attachment portion 27 with respect to the center 31 of the resonation element.

Here, an angle formed by a first center line 56 connecting the center 31 of the resonation element and a center 36 of the first attachment portion, and the virtual center line 38 is considered to be $\theta_1$. An angle formed by a second center line 57 connecting the center 31 of the resonation element and a center 37 of the second attachment portion, and the virtual center line 38 is considered to be $\theta_2$.

In this case, conditions thereof are $0°<\theta_1<90°$, $0°<\theta_2<90°$, and $0°<|\theta_1-\theta_2|<10°$.

According to such a configuration, the distance between the first attachment portion 26 and the second attachment portion 27 can be shortened. Moreover, the first attachment portion 26 and the second attachment portion 27 are disposed at positions in substantially line symmetry with respect to the virtual center line 38 in a planar view of the package 22. Therefore, during a heat processing step in the manufacture at the time of drying, reflowing, and the like, an influence of thermal stress (in-plane stress) which is generated due to the difference between heat expansion coefficients of the resonation element 21 and the bottom plate 34, and is applied to the resonation element 21 can be reduced. Thus, it is possible to reduce the fluctuation in the oscillation frequencies of the quartz crystal resonator 30.

Subsequently, descriptions will be given with reference to FIG. 3 regarding a case where $\theta_1$ and $\theta_2$ satisfy the conditions $0°<\theta_1<30°$ and $0°<\theta_2<30°$ and a case where the conditions $0°<\theta_1<15°$ and $0°<\theta_2<15°$ are satisfied.

Figure 3:
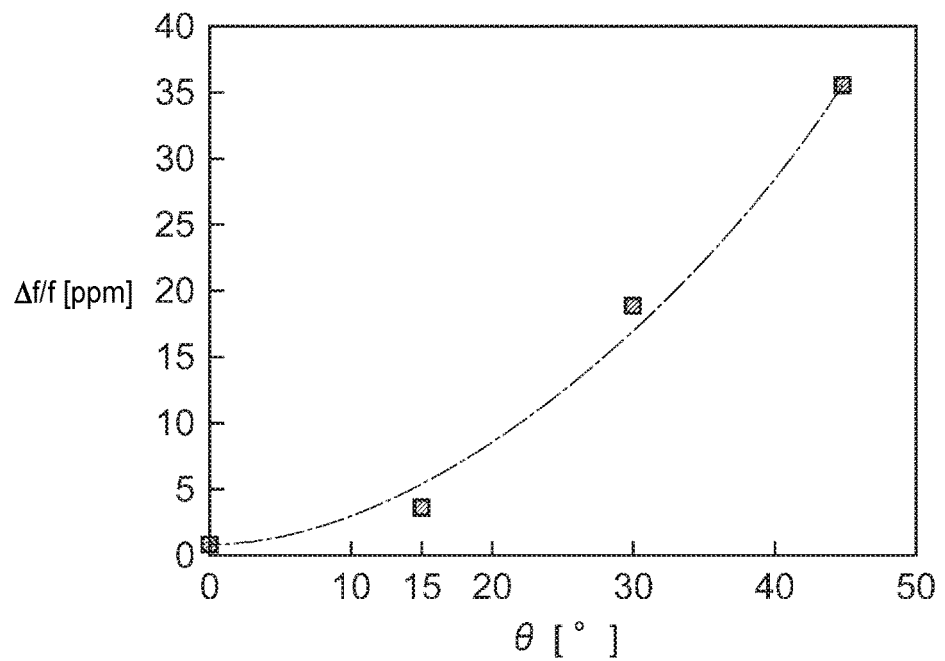
FIG. 3 is a diagram illustrating a relationship between an angle θ which is formed by a first center line connecting a center of the heater and a center of a first attachment portion, and a virtual center line; and variation Δf/f of an oscillation frequency which is caused by thermal stress, according to the first embodiment.

FIG. 3 is a diagram illustrating a relationship between the angle $\theta_1$ formed by the first center line 56 connecting the center 31 of the resonation element and the center 36 of the first attachment portion, and the virtual center line 38 (or the angle $\theta_2$ formed by the second center line 57 connecting the center 31 of the resonation element and the center 37 of the second attachment portion, and the virtual center line 38); and variation $\Delta f/f$ of the oscillation frequency which is caused by thermal stress, according to the first embodiment.

FIG. 3 is a calculated result of a finite element method (FEM) regarding changes in the oscillation frequencies caused by thermal stress which is generated when the ambient temperature of the quartz crystal resonator 30 is changed from +85° C. to −40° C. while having $\theta=\theta_1$ and $\theta_2$ as a parameter (horizontal axis). The vertical axis indicates standardized frequency variation in $\Delta f/f$ [ppm].

Since $\theta_1$ and $\theta_2$ satisfy the condition $0°<|\theta_1-\theta_2|<10°$, the first attachment portion 26 and the second attachment portion 27 are disposed at positions in substantially line symmetry with respect to the virtual center line 38.

First, when the conditions are $0°<\theta_1<30°$ and $0°<\theta_2<30°$, the distance between the first attachment portion 26 and the second attachment portion 27 can be shortened further. As illustrated in FIG. 3, when θ satisfies the condition $0°<\theta<30°$, the variation of the oscillation frequency caused by thermal stress is reduced further compared to a case of $30°\leq\theta$. In other words, during the heat processing step at the time of drying, reflowing, and the like, thermal stress generated due to the difference between heat expansion coefficients of the resonation element 21 and the package 22 can be reduced further.

Subsequently, when the conditions are $0°<\theta_1<15°$ and $0°<\theta_2<15°$, the distance between the first attachment portion 26 and the second attachment portion 27 can be shortened further. As illustrated in FIG. 3, when θ satisfies the condition $0°<\theta<15°$, the variation of the oscillation frequency caused by thermal stress is reduced further compared to a case of $15°\leq\theta$. In other words, during the heat processing step at the time of drying, reflowing, and the like, thermal stress generated due to the difference between heat expansion coefficients of the resonation element 21 and the package 22 can be reduced further.

Lid

Subsequently, for being a plate-like member, the lid 28 is easily formed and excels in stability of the shape. The lid 28 is formed of ceramic, metal, glass, or the like. When the lid 28 is formed of kovar (metal), for example, there is an advantage in that strength thereof is greater than that of other materials in general. Moreover, as plate-like kovar is used for the lid 28, the seaming ring 40 formed of kovar is fused with the lid 28 in the same fusion state and is likely to alloy therewith at the time of sealing. Thus, it is possible to perform sealing easily and reliably.

Without being limited to kovar, other materials may be used as the lid 28. For example, a 42 alloy, a metallic material such as stainless steel, the same material as the side walls 35 of the package 22 (for example, ceramic), and the like can be used.

Then, the seaming ring 40 is fused by using a seam welding method or the like. As illustrated in FIG. 2, as the package 22 and the lid 28 are bonded together, the opening of the concave portion surrounded by the bottom plate 34 and the side walls 35 of the package 22 is blocked, thereby forming a sealed inner space 29 for accommodating the resonation element 21 and the like.

The internal pressure of the inner space 29 can be set to a desired air pressure. For example, the inner space 29 can be under the atmospheric pressure by being filled with nitrogen gas, or can be in a pressure state lower than normal atmospheric pressure ($1\times10^3$ Pa to $1\times10^{10}$ Pa (JIS Z 8126-1: 1999)) (hereinafter, referred to as a vacuum).

The inner space 29 according to the present embodiment is set to a vacuum. When the inner space 29 becomes a vacuum, a value Q of the quartz crystal resonator 30 can be increased so that the oscillation frequencies become stable and heat discharged to the outside can be reduced. Thus, low power consumption can be achieved.

Oscillator

Figure 4:
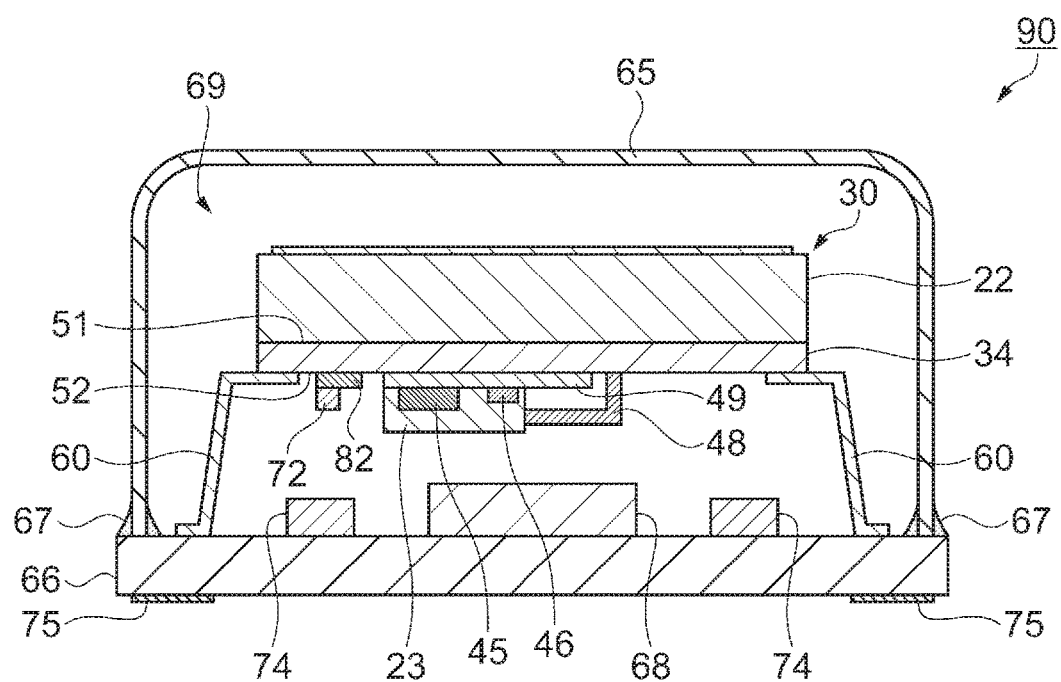
FIG. 4 is a schematic cross-sectional view illustrating an oscillator applied with the quartz crystal resonator as a resonation device according to the first embodiment in which the heater is mounted.

Subsequently, descriptions will be given with reference to FIG. 4 regarding the oscillator 90 in which the quartz crystal resonator 30 according to the present embodiment is mounted. FIG. 4 is a schematic cross-sectional view of the oscillator 90 applied with the quartz crystal resonator 30 in which the heater 23 as a resonation device according to the first embodiment is mounted. As illustrated in FIG. 4, the oscillator 90 is configured to include the quartz crystal resonator 30 in which the heater 23 and an IC chip (chip component) 72 are mounted, legs 60, a case 65, a base 66, a circuit element 68, other circuit configuration components 74, and the like.

The legs 60 in addition to the heater 23 are connected to the second main surface 52 of the quartz crystal resonator 30, and the IC chip 72 is fixed thereto via a bonding member 82 such as a brazing filler metal or an adhesive. The IC chip 72 has a drive circuit (oscillation circuit) for controlling the drive of the quartz crystal resonator 30, and frequencies can be drawn out by causing the IC chip 72 to drive the quartz crystal resonator 30. The above-referenced other circuit configuration components 74 denote a configuration of electronic components in which a resistor, a coil, a capacitor, and the like are combined.

Leg

The legs 60 are members fixing the quartz crystal resonator 30 and the base 66 in a two-tier structure. In other words, on account of the structure of the legs 60, heat generated from the heater 23 which is fixed to the quartz crystal resonator 30 is unlikely to be transferred to the base 66 in which the below-described circuit element 68 and the like are mounted. According to such structure, the circuit element 68 and the like are less likely to be exposed to a high temperature by the heater 23, and thus, the oscillator 90 can oscillate stable frequencies.

The legs 60 are configured to be formed with conductive metal frames so as to be able to electrically connect the quartz crystal resonator 30 and the base 66. As a material of the legs 60, a material of a lead frame can be exemplified. In other words, thin plates formed with a Cu-based material (for example, Cu—Fe—P), a Fe-based material (for example, Fe-42% Ni), or other metallic materials which excel in mechanical strength, electrical conductivity, heat conductivity, corrosion resistance, and the like are used as the legs 60. Moreover, outer surfaces of the legs 60 may be subjected to plating of Au, Ag, Sn, Pd, soldering, or the like.

Case

Subsequently, the case 65 is a concave container which can accommodate the package 22 in which the resonation element 21 is accommodated, the heater 23, and the like. Without being limited to a rectangular shape, the planar shape of the case 65 may be a polygonal shape, a circular shape, an oval shape, or the like. The case 65 includes an opening to the extent through which the resonation element 21 and the heater 23 can be introduced into the case 65, and the case 65 is formed with an inorganic material such as ceramic and glass, a resin, or a metallic material such as kovar.

Base

The base 66 has a flat plate shape so as to seal the opening of the case 65. The shape of the base 66 is not particularly limited. The base 66 may have a shape to such an extent that the bottom plate 34 is prevented from coming into contact with the outside, or may have a shape in which a sealed space can be formed by sealing the opening of the case 65. The base 66 can be formed with ceramic, glass, or metal, for example. In the present embodiment, the base 66 is formed with kovar (metal).

A surface (inner surface) of the base 66 on a side to which the legs 60 are connected is provided with the below-described circuit element 68, other circuit configuration components 74, and the like. A surface (outer surface) of the base 66 on a side opposite to that to which the legs 60 are connected is provided with external connection terminals 75 and the like. The external connection terminals 75 are electrically connected to the circuit element 68, other circuit configuration components 74, and the like. The base 66 includes wiring for being electrically connected to the heater 23 via the legs 60.

An inner space 69 is formed by causing the base 66 and the case 65 which is covered with the base 66 to adhere to each other using soldering 67 or the like. The base 66 and the case 65 can be caused to adhere to each other by adopting plasma welding, seam welding, ultrasound bonding, and an adhesive, for example, in addition to the soldering 67.

The inner space 69 is a space in which the resonation element 21, the heater 23, the circuit element 68, the IC chip 72, and the like are accommodated. The inner space 69 may be exposed to the atmosphere or may be an air-tight space. When the inner space 69 is an air-tight space, the resonation element 21 and the heater 23 can be caused to be in a decompressed state or an inert-gas atmosphere. In the present embodiment, the inner space 69 is in a decompressed state of a substantial vacuum, and thus, it is possible to enhance the efficiency of heating energy in the heater 23.

Circuit Element

Subsequently, the circuit element 68 is connected to the top surface of the base 66 by using a conductive adhesive (not illustrated) or the like. For example, the circuit element 68 includes an oscillation circuit for oscillating the resonation element 21 of the quartz crystal resonator 30, a control circuit for controlling the temperature of the heater 23, and the like.

Modification Example

Subsequently, descriptions will be given with reference to FIG. 5 regarding a quartz crystal resonator 130 according to a modification example of the first embodiment. Portions common to those in the first embodiment will be applied with the same reference numerals and signs, and descriptions thereof will not be repeated. Descriptions will be mainly given regarding the portions different from those in the first embodiment.

Quartz Crystal Resonator

Figure 5:
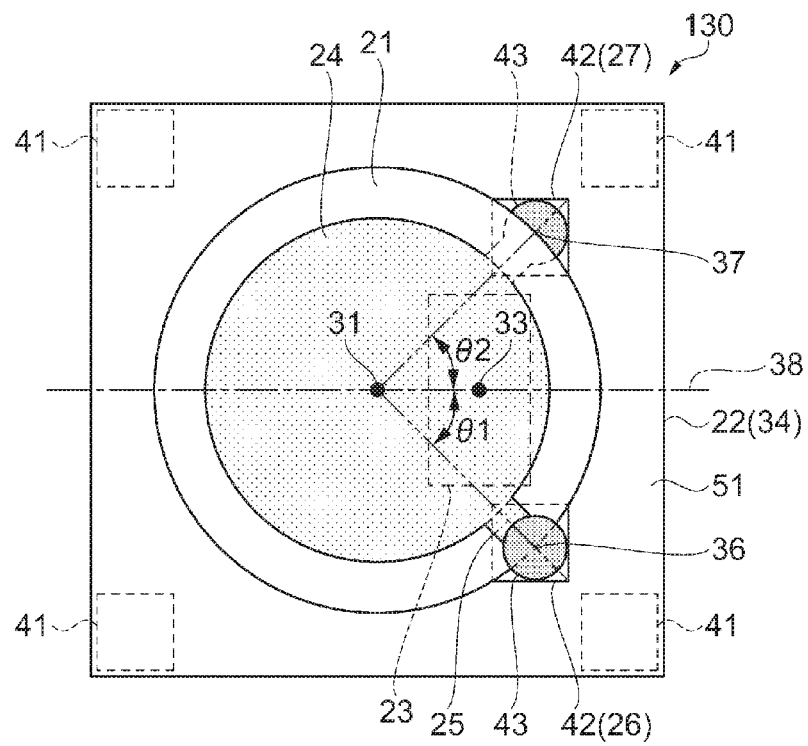
FIG. 5 is a schematic plan view illustrating the quartz crystal resonator as a resonation device according to a modification example of the first embodiment in which the heater is mounted.

FIG. 5 is a schematic plan view illustrating the quartz crystal resonator 130 as a resonation device in which the heater is mounted, according to the modification example of the first embodiment. As illustrated in FIG. 5, the quartz crystal resonator 130 has relative positions between the resonation element 21 and the heater 23 set differently compared to the quartz crystal resonator 30 of the first embodiment.

Similar to the first embodiment, the resonation element 21 according to the modification example is attached and fixed to the external connection electrodes 42 in a cantilever manner by applying the conductive adhesive 43 or the like onto the external connection electrodes 42 at two places of the first attachment portion 26 and the second attachment portion 27 which are disposed on the first main surface 51 of the bottom plate 34 of the package 22.

Similar to the first embodiment, when a line connecting a center 33 of the heater and a center 31 of the resonation element in a planar view of the package 22 is considered to be a virtual center line 38 which is a virtual line, the first attachment portion 26 and the second attachment portion 27 are disposed at positions in line symmetry with respect to the virtual center line 38.

However, being different from the first embodiment, the center 33 of the heater and the first attachment portion 26 are disposed on the same side, and the center 33 of the heater and the second attachment portion 27 are disposed on the same side, with respect to the center 31 of the resonation element.

According to such a configuration, the distance from the heater 23 to the resonation element 21 via the first attachment portion 26 and the second attachment portion 27 disposed in the bottom plate 34 of the package 22 is shortened. Accordingly, heat generated from the heater 23 is likely to be transferred to the resonation element 21. Therefore, temperature changes of the resonation element 21 are reduced, and the oscillation frequencies of the quartz crystal resonator 130 are stabilized. Moreover, since heat loss in the heat transfer path is reduced, low power consumption can be achieved.

Second Embodiment

Subsequently, an oscillator 190 according to a second embodiment will be described with reference to FIG. 6. Configurations similar to those in the oscillator 90 according to the above-referenced first embodiment will be applied with the same reference numerals and signs, and descriptions thereof will not be repeated.

Oscillator

Figure 6:
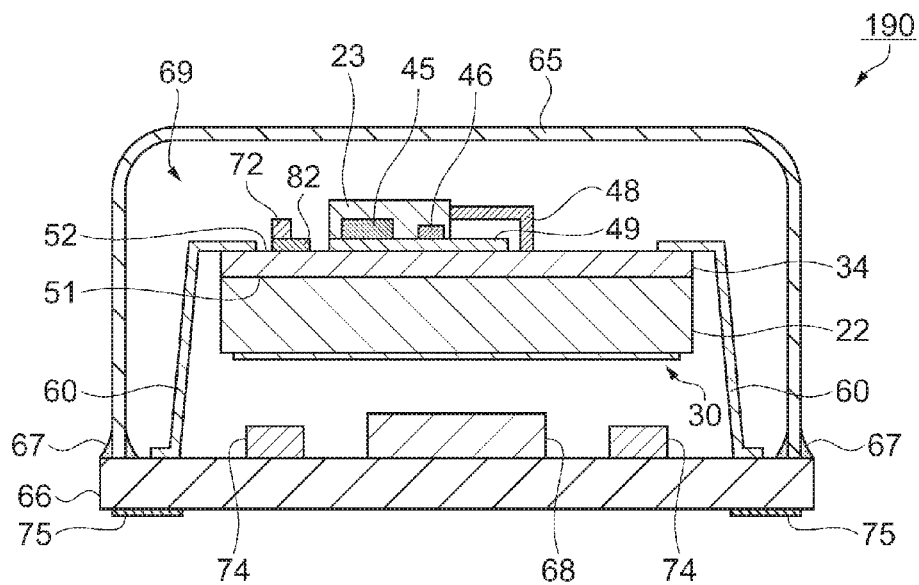
FIG. 6 is a schematic cross-sectional view illustrating an oscillator applied with the quartz crystal resonator as a resonation device according to a second embodiment in which the heater is mounted.

FIG. 6 is a schematic cross-sectional view of the oscillator 190 applied with the quartz crystal resonator 30 in which the heater 23 as a resonation device according to the second embodiment is mounted. As illustrated in FIG. 6, the oscillator 190 is configured to include the quartz crystal resonator 30 in which the heater 23 and the IC chip (chip component) 72 are mounted, the legs 60, the case 65, the base 66, the circuit element 68, other circuit configuration components 74, and the like. The configuration components are same as those in the first embodiment.

However, in the second embodiment, the heater 23 is disposed on a side opposite to the base 66 with respect to the quartz crystal resonator 30. In other words, the oscillator 190 has structure different from that in the first embodiment in that the quartz crystal resonator 30 is vertically inverted and fixed.

According to such a configuration, in the oscillator 190 according to the second embodiment, it is possible to achieve an effect similar to that in the above-referenced oscillator 90 according to the first embodiment. Moreover, since the distance between the heater 23 and the circuit element 68, other circuit configuration components 74, and the like disposed on the base 66 becomes longer compared to that in the first embodiment, the circuit element 68, other circuit configuration components 74, and the like can be less likely to be exposed to a high temperature by the heater 23.

Electronic Apparatus

Subsequently, descriptions will be given in detail regarding electronic apparatus in which the quartz crystal resonator 30 (or the quartz crystal resonator 130, hereinafter, descriptions will be focused on the quartz crystal resonator 30) as a resonation device according to the embodiments of the invention, with reference to FIGS. 7 to 9.

Figure 7:
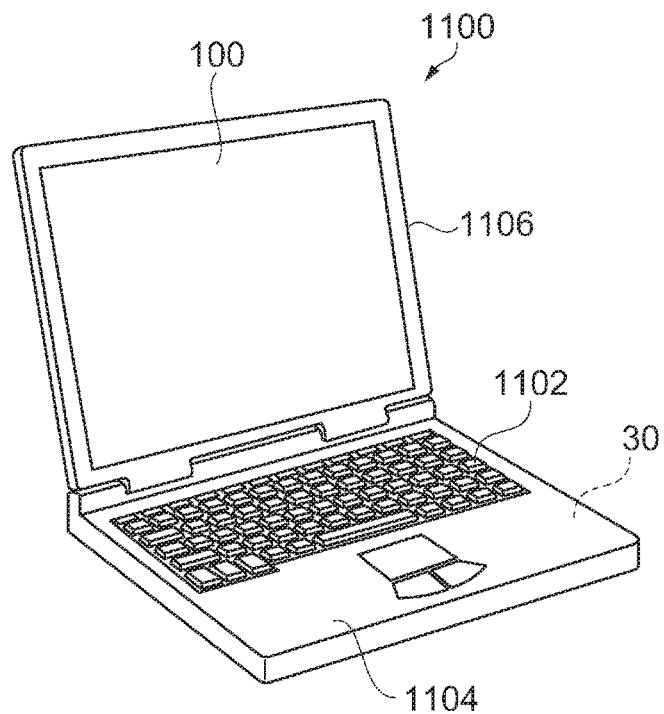
FIG. 7 is a perspective view illustrating a configuration of a mobile personal computer as an example of an electronic apparatus.

FIG. 7 is a perspective view illustrating a configuration of a mobile personal computer as an example of an electronic apparatus. In the diagram, a personal computer 1100 is configured to include a main body 1104 which is provided with a keyboard 1102, and a display unit 1106 which is provided with a display 100. The display unit 1106 is turnably supported by the main body 1104 via a hinge structure portion. The quartz crystal resonator 30 provided with a function as a timing source in signal processing is built in such a personal computer 1100.

Figure 8:
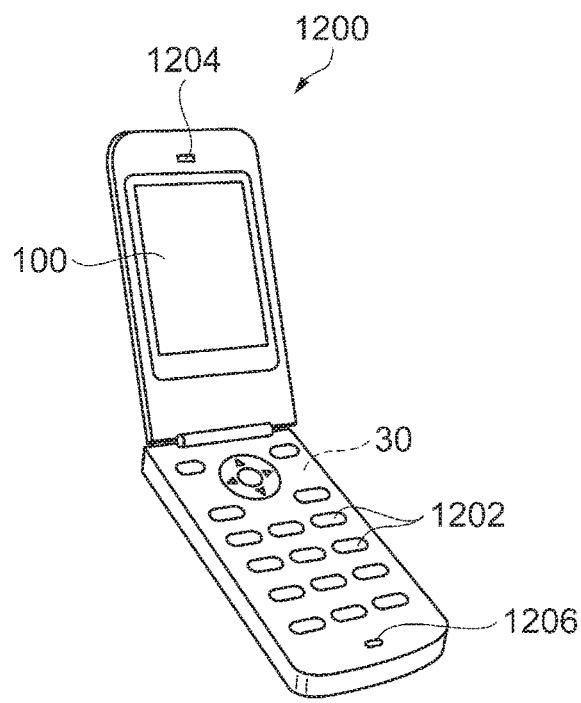
FIG. 8 is a perspective view illustrating a configuration of a portable telephone as an example of the electronic apparatus.

FIG. 8 is a perspective view illustrating a configuration of a portable telephone as an example of the electronic apparatus. In the diagram, a portable telephone 1200 (including PHS) includes a plurality of operation buttons 1202, an ear piece 1204, and a mouth piece 1206. The display 100 is disposed between the operation buttons 1202 and the ear piece 1204. The quartz crystal resonator 30 provided with a function as a timing source in signal processing is built in such a portable telephone 1200.

Figure 9:
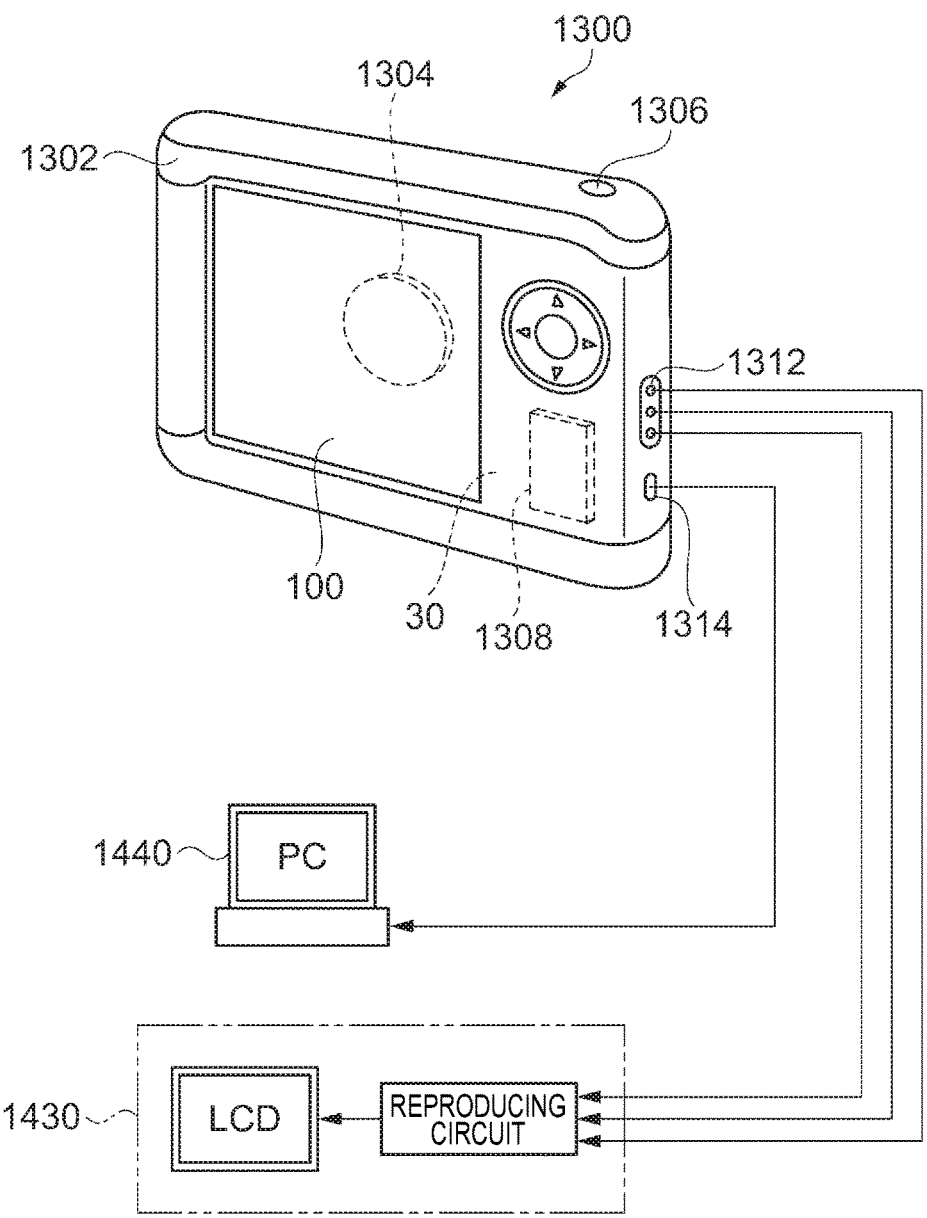
FIG. 9 is a perspective view illustrating a configuration of a digital still camera as an example of the electronic apparatus.

FIG. 9 is a perspective view illustrating a configuration of a digital still camera as an example of the electronic apparatus. The diagram simply illustrates connection with respect to external instruments as well. Here, compared to a film camera in the related art in which a silver-salt photograph film is exposed to light with an optical image of an imaging object, a digital still camera 1300 generates an image-captured signal (an image signal) by photoelectrically converting an optical image of an imaging object using an image-capturing element such as a charge coupled device (CCD).

The display 100 is provided on the rear surface of a case (body) 1302 in the digital still camera 1300, which is configured to perform displaying based on an image-captured signal using the CCD. The display 100 functions as a view finder which displays an imaging object as an electronic image. A photo-detection unit 1304 including an optical lens (image-capturing optical system), the CCD, and the like is provided on the front surface side (rear surface side in the diagram) of the case 1302.

When a photographer checks the image of an imaging object which the display 100 displays and presses a shutter button 1306, an image-captured signal of the CCD at the moment is transmitted to a memory 1308 and is stored therein. A video signal output terminal 1312 and an input-output terminal 1314 for data communication are also provided on a side surface of the case 1302 in the digital still camera 1300.

As illustrated in the diagram, a television monitor 1430 is connected to the video signal output terminal 1312 and a personal computer 1440 is connected to the input-output terminal 1314 for data communication as necessary. Moreover, in accordance with predetermined operations, an image-captured signal stored in the memory 1308 is configured to be output to the television monitor 1430 or the personal computer 1440. The quartz crystal resonator 30 provided with a function as a timing source in signal processing is built in such a digital still camera 1300.

The electronic apparatus including the quartz crystal resonator 30 according to the embodiments of the invention can be applied to an ink jet-type discharge apparatus (for example, an ink jet printer), a laptop personal computer, a television set, a video camera, a video tape recorder, a car navigation apparatus, a pager, an electronic organizer (including an organizer with a communication function), an electronic dictionary, a pocket calculator, an electronic game device, a word processor, a workstation, a TV phone, a crime-preventing television monitor, an electronic binoculars, a POS terminal, a medical instruments (for example, an electronic thermometer, a blood pressure meter, a blood sugar meter, an electrocardiogram measuring apparatus, an ultrasound diagnostic apparatus, and an electronic endoscope), a fish finder, various types of measurement equipment, meters (for example, meters for a vehicle, an aircraft, and a vessel), an electronic apparatus such as a flight simulator, mobile telecommunication station equipment, storage area network equipment such as a router and a switch, a local area network equipment, and network transmission equipment, for example, in addition to the personal computer 1100 (a mobile personal computer) in FIG. 7, the portable telephone 1200 in FIG. 8, and the digital still camera 1300 in FIG. 9.

Moving Object

Figure 10:
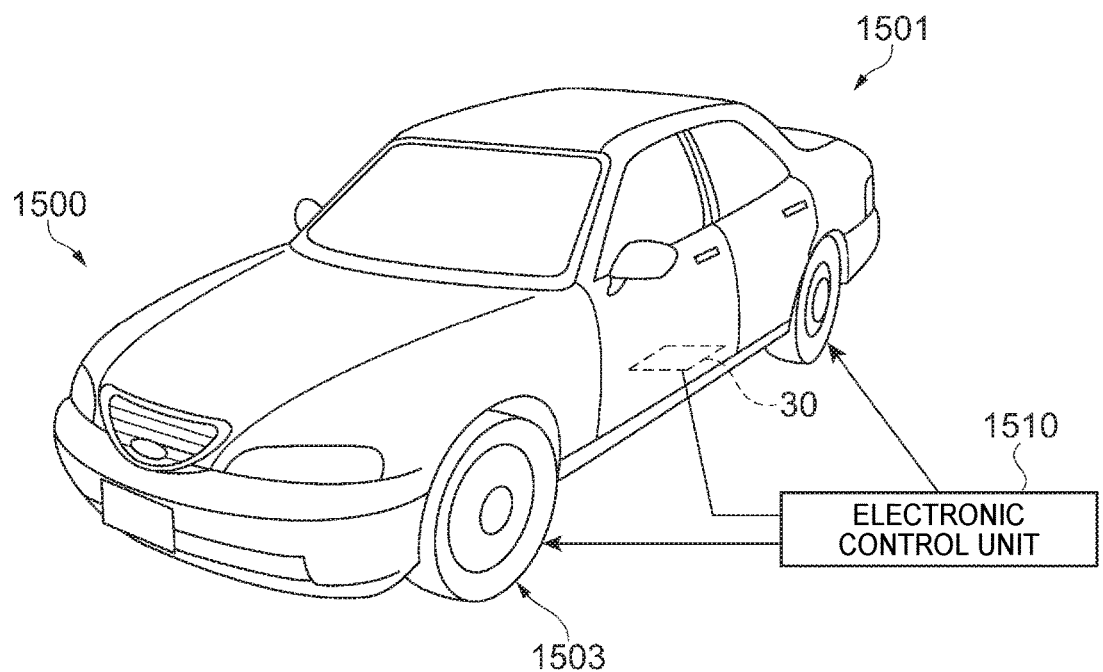
FIG. 10 is a perspective view illustrating a configuration of an automobile as an example of a moving object.

FIG. 10 is a perspective view illustrating a configuration of an automobile 1500 as an example of a moving object. The quartz crystal resonator 30 according to the invention is mounted in the automobile 1500. For example, as illustrated in FIG. 10, in the automobile 1500 as a moving object, the quartz crystal resonator 30 is built in an electronic control unit 1510 for controlling tires 1503 and the like, and the electronic control unit 1510 is mounted in a vehicle body 1501.

In addition, the quartz crystal resonator 30 can also be widely applied to electronic control units (ECU) for a keyless entry system, an immobilizer, a car navigation system, a car air conditioning system, an antilock brake system (ABS), an airbag, a tire pressure monitoring system (TPMS), an engine control system, a battery monitor of a hybrid automobile and an electric car, and a vehicle body posture control system.

Hereinbefore, the embodiments of the resonator, the oscillator, the electronic apparatus, and the moving object according to the invention are described with reference to the drawings. However, the invention is not limited to the above-described embodiments, and the configuration of each of the units and portions can be replaced with an arbitrary configuration having a similar function. Moreover, other arbitrary configuration components may be added to the invention. Furthermore, each of the embodiments may be suitably combined.

The entire disclosure of Japanese Patent Application No. 2015-003924, filed Jan. 13, 2015 is expressly incorporated by reference herein.

What is claimed is:

1. A resonation device comprising:
a substrate;
a resonation element that is attached to a first surface of the substrate in a cantilever manner; and
a heater that is disposed on a second surface opposite to the first surface,
wherein a center of the heater and a center of the resonation element are shifted spaced from each other in a planar view.

2. The resonation device according to claim 1,
wherein the resonation element is attached to the substrate at a first attachment portion and a second attachment portion.

3. The resonation device according to claim 1,
wherein the heater is arranged so as to overlap with the resonation element in a planer view.

4. The resonation device according to claim 1,
wherein when an angle formed by a line which connects the center of the resonation element and a center of the first attachment portion and a virtual line which connects the center of the heater and the center of the resonation element in a planar view is θ1 and an angle formed by a line which connects the center of the resonation element and a center of the second attachment portion and the virtual line which connects the center of the heater and the center of the resonation element in a planar view is θ2, conditions 0°<θ1<90°, 0°<θ2<90°, and 0°<|θ1−θ2|<10° are satisfied.

5. The resonation device according to claim 3, wherein conditions 0°<θ$_1$<30° and 0°<θ$_2$<30° are satisfied.

6. The resonation device according to claim 4, wherein conditions $0°<\theta_1<15°$ and $0°<\theta_2<15°$ are satisfied.

7. The resonation device according to claim 1, wherein the heater is smaller than the resonation element in a planer view.

8. The resonation device according to claim 1, wherein the center of the heater and a center of the first attachment potion are positioned on the same side with respect to the center of the resonation element in a planer view.

9. The resonation device according to claim 1, wherein the center of the heater and a center of the first attachment potion are disposed on the opposite side with respect to the center of the resonation element in a planer view.

10. The resonation device according to claim 1, further comprising;
   a heat conduction layer disposed between the heater and the second surface.

11. An oscillator comprising:
   the resonation device according to claim 1.

12. The oscillator according to claim 11, further comprising;
   a leg that is attached to the resonation device; and
   a base that is attached to the leg.

13. The oscillator according to claim 12, further comprising:
   a circuit element disposed on the base.

14. The oscillator according to claim 12, wherein the heater and the base are disposed to the opposite side with respect to the substrate.

15. The oscillator according to claim 12, wherein the heater and the base are disposed to the same side with respect to the substrate.

16. An electronic apparatus comprising:
   the resonation device according to claim 1.

17. A moving object comprising:
   the resonation device according to claim 1.

* * * * *